(12) United States Patent
Dorschky et al.

(10) Patent No.: US 7,149,270 B2
(45) Date of Patent: Dec. 12, 2006

(54) CLOCK RECOVERY CIRCUIT

(75) Inventors: Claus Dorschky, Eckental (DE); Theodor Kupfer, Feucht (DE)

(73) Assignee: CoreOptics, Inc., Nuremberg (DE)

( * ) Notice: Subject to any disclaimer, the term of this patent is extended or adjusted under 35 U.S.C. 154(b) by 834 days.

(21) Appl. No.: 10/138,210

(22) Filed: May 3, 2002

(65) Prior Publication Data

US 2002/0186804 A1    Dec. 12, 2002

Related U.S. Application Data

(60) Provisional application No. 60/288,376, filed on May 3, 2001.

(51) Int. Cl.
*H03D 3/24*    (2006.01)

(52) U.S. Cl. ........................ 375/376; 327/156

(58) Field of Classification Search ................ 375/326, 375/327, 375, 376; 327/147–150, 156–159; 331/1 R, 10, 11, 25, 1 A, 56
See application file for complete search history.

(56) References Cited

U.S. PATENT DOCUMENTS 3,795,872 A    3/1974    Napolitano et al.
4,787,097 A  * 11/1988   Rizzo ......................... 375/375
4,904,957 A    2/1990    Coquerel
4,935,706 A  * 6/1990    Schenberg .................... 331/11
4,953,185 A    8/1990    Goode
5,432,827 A    7/1995    Mader
5,450,447 A  * 9/1995    Dutta .......................... 375/344
5,530,389 A    6/1996    Rieder
5,566,204 A   10/1996    Kardontchik et al.
5,726,607 A    3/1998    Brede et al.
5,955,928 A    9/1999    Smith et al.

OTHER PUBLICATIONS

International Search Report, Jan. 3, 2003.
PCT Written Opinion dated Jun. 30, 2003.
Supplementary European Search Report dated Nov. 2, 2004.

* cited by examiner

*Primary Examiner*—Don N. Vo
(74) *Attorney, Agent, or Firm*—Edwards Angell Palmer & Dodge LLP; Howard M. Gitten

(57) ABSTRACT

A clock recovery circuit for use with a high-speed data signal having a low signal to noise ratio is disclosed. The circuit includes a first phase locked loop circuit operating in a fast acquisition mode for acquiring the clock from a data signal, a second phase locked loop circuit for operating in a normal mode to recover the clock signal in the digital data signal once the first phase locked loop circuit has acquired the clock from the data signal, and a switch circuit responsive to switch control signals for switching between the first phase locked loop circuit and the second phase locked loop circuit after the first phase locked loop circuit has acquired the digital data signal.

19 Claims, 4 Drawing Sheets

CLOCK RECOVERY CIRCUIT

CROSS REFERENCE TO RELATED APPLICATIONS

Priority is claimed from provisional application Ser. No. 60/288,376, filed May 3, 2001.

FIELD OF THE INVENTION

This invention relates to clock recovery circuits, and more particularly, to a clock recovery circuit used with high-speed digital data.

BACKGROUND OF THE INVENTION

Digital data signals, when transmitted, frequently contain jitter, that is, a distortion of the signal caused by poor synchronization. If jitter or other noise is significant the digital data signals more closely resemble analog signals. The process of locking onto or acquiring the clock from a data signal, and thus, compensating for the jitter, is referred to as recovering the clock signal in the data signal. A Clock Recovery (CR) circuit for recovering the clock signal with improved jitter tolerance often employs a Voltage Controlled Oscillator (VCO), which has a large modulation bandwidth, to lock onto the digital data signal. The use of the VCO is normally considered advantageous, as the VCO has a large frequency tolerance, which compensates for the jitter in the data signal. The large frequency tolerance of the VCO, however, is also a drawback, because it increases the frequency acquisition time when used with a digital data signal having a low Signal to Noise Ratio (SNR). In some instances, the wide frequency tolerance of the VCO can prevent the clock recovery circuit from locking onto the digital data signal.

One solution to the problem of using a VCO to lock onto a digital data signal with a low SNR has been to combine the VCO with a Voltage Controlled Crystal Oscillator (VCXO), which is more stable, in a combination circuit. In the combination circuit, the VCXO acquires the clock from the data signal, in what is known as the "fast acquisition" state, while the VCO locks onto the data signal once the VCXO has acquired the clock from the data signal, in what is known as the "locked" or "steady" state. The combination circuit can thus be said to operate in two modes: the normal mode and the fast acquisition mode. The combination circuit limits the frequency error of the VCO since the VCXO, which has a small modulation bandwidth, defines the frequency acquisition time of the digital circuit, and not the VCO. The combination circuit improves the lock-in behavior of a digital data signal with a low SNR as compared to a circuit with only a VCO.

A combination circuit encounters significant difficulties, however, when the input data, which has been valid for a predetermined length of time, suddenly becomes invalid. When this occurs, the circuit is said to enter into a "holdover" state. In the holdover state, the VCO and the VCXO are locked to the data frequency, and are no longer responsive to the digital data signal. The VCO follows the VCXO, which is free running. When valid data later appears in the digital data signal, the VCO and the VCXO must enter the fast acquisition state in order to reacquire the clock from the data signal. The reacquisition of the clock can take a long time. The relatively small modulation bandwidth of the VCXO is the chief factor causing the long reacquisition time.

The aforementioned problem is acute for clock recovery circuits that are used with data signals having very low SNR values. It is particularly problematic when the circuits are used in optical networking applications such as Synchronous Optical Network (SONET) and Synchronous Digital Hierarchy (SDH) systems, which use forward error correction (FEC). The clock recovery circuit in such applications must reliably lock onto signals with very low SNR values with a relatively short frequency acquisition time.

SUMMARY OF THE INVENTION

In accord with the present invention, a clock recovery circuit for use with a high-speed data signal having a low signal to noise ratio includes a first phase locked loop circuit operating in a fast acquisition mode for acquiring the clock from the data signal, a second phase locked loop circuit for operating in a normal mode to recover the clock signal in the data signal once the first phase locked loop circuit has acquired the clock from the data signal, and a switch circuit responsive to switch control signals for switching between the first phase locked loop circuit and the second phase locked loop circuit after the first phase locked loop circuit has acquired the clock from the data signal.

Further in accord with the present invention, in a clock recovery circuit with first and second phase locked loop circuits, for use with a high speed digital data signal having a low signal to noise ratio, the improvement comprises a switch circuit for switching between the first phase locked loop circuit operating in a fast acquisition mode for acquiring the clock from the data signal and the second phase locked loop circuit operating in a normal mode after the first phase locked loop circuit has acquired the clock.

Still further in accord with the present invention, a clock recovery circuit for use with a high speed digital data signal having a low signal to noise ratio includes a first PLL circuit operating in a fast acquisition mode for acquiring the clock from the data signal. The first PLL circuit includes an inner PLL circuit and an outer PLL circuit. The inner PLL circuit includes a first phase detector for receiving the digital data signal, an LC-voltage controlled oscillator coupled to the first phase detector, and a first loop filter coupled to the LC-voltage controlled oscillator. The outer PLL circuit includes a frequency/phase detector for receiving the data signal, a voltage controlled crystal oscillator coupled to the second loop filter, and a second loop filter coupled to the phase/frequency detector and generating switch control signals. A second PLL circuit for operating in a normal mode to recover the clock signal in the data signal once the first PLL circuit has acquired the clock state includes an inner PLL circuit and an outer PLL circuit. The inner PLL circuit includes the phase/frequency detector, a third loop filter coupled to the phase/frequency detector, and the LC-voltage controlled oscillator. The outer PLL circuit includes the first phase detector, the second loop filter coupled to the first phase detector, the voltage controlled crystal oscillator coupled to the second loop filter, and the inner PLL circuit of the second PLL circuit. A switch circuit responsive to the switch control signals switches between the first PLL circuit and the second PLL circuit after the first PLL circuit has acquired the data signal.

DETAILED DESCRIPTION OF THE PREFERRED EMBODIMENT

Figure 1:
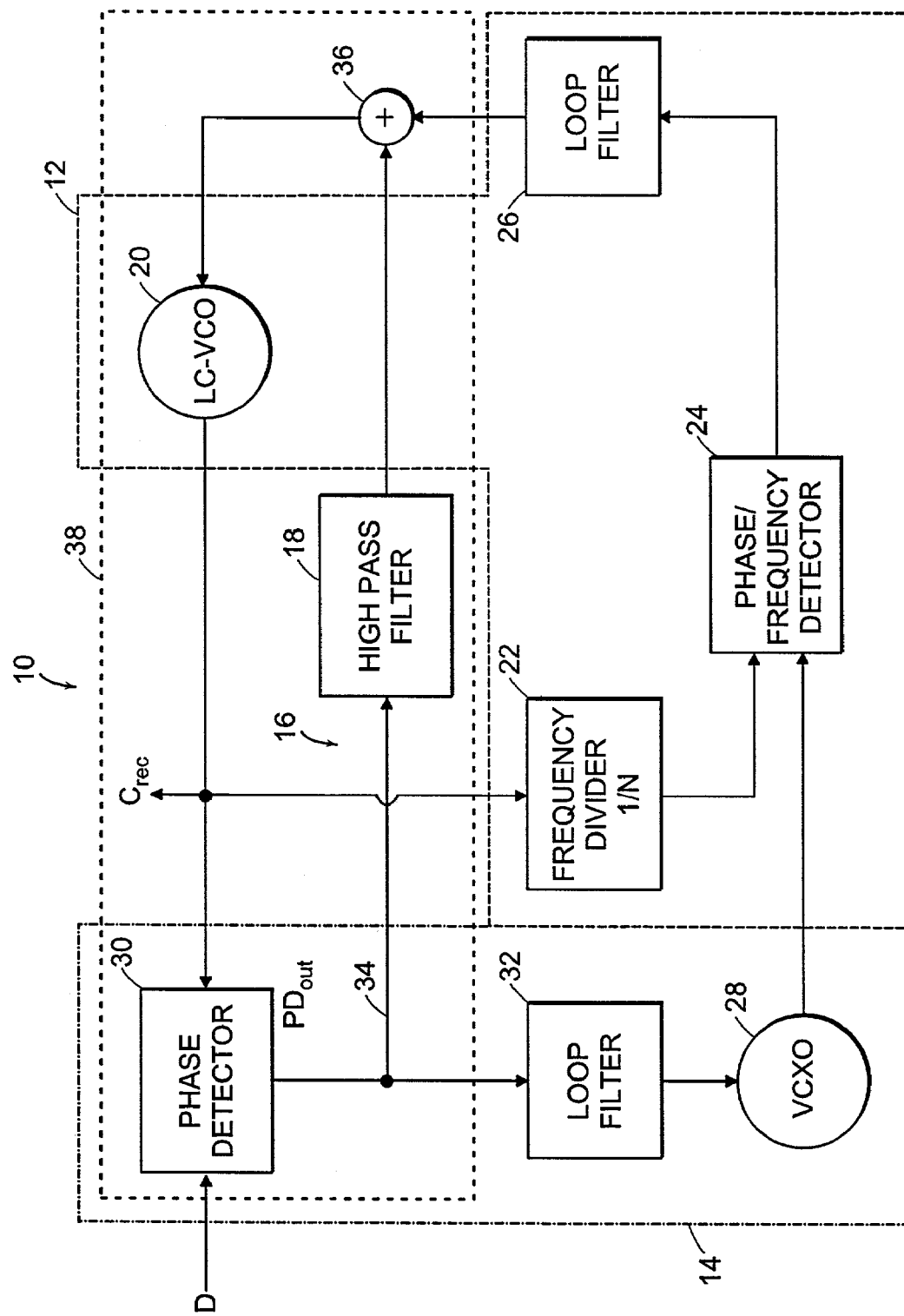
FIG. 1 is a block drawing of a prior art circuit.

Referring to the drawings, and initially to FIG. 1 thereof, a prior art clock recovery circuit 10 is shown. The prior art clock recovery circuit 10 has two phase locked loop circuits (PLL's) 12, 14, and one interlacing path 16 having a high pass filter 18. The inner PLL circuit 12 comprises an inductance capacitance voltage controlled oscillator (LC-VCO) 20, a 1/N frequency divider 22, a phase/frequency detector 24, and a loop filter 26. The 1/N frequency divider 22 supplies a divided signal from the LC-VCO 20 as a clock signal for the phase/frequency detector 24, and may be omitted without affecting the operation of the circuit 10. The outer PLL circuit 14 includes a voltage controlled crystal oscillator (VCXO) 28, a phase detector 30, a loop filter 32, and the inner PLL circuit 12. An input data signal D having a clock signal therein is supplied to the phase detector 30, which outputs a phase detected $PD_{out}$ signal in response thereto. A line 34 supplies the phase detected $PD_{out}$ from the phase detector 30 to the high-pass filter 18 which provides an input to a summing circuit 36. Summing circuit 36 provides an output to the LC-VCO 20. It is to be appreciated that the interlacing path 16 of the line 34 and the high-pass filter 18, together with the LC-VCO 20 and the phase detector 30, function as another PLL circuit 38 for high frequencies. The PLL circuit 38 accounts for jitter within the tolerance requirements for the circuit 10. The circuit 10 locks onto or recovers the clock signal in the data signal D and outputs a recovered clock signal $C_{rec}$ on line 40.

The circuit 10, however, encounters significant difficulties in certain applications, such as data signals that have very low SNR values. Such data signals are frequently found in optical networking applications such as SONET and SDH, which use forward error correction (FEC). The LC-VCO 20 in the circuit 10 locks onto the data signal D for a significant amount of time and operates in a steady state condition. In the steady state condition, when the input data of the data signal D has been valid for a predetermined length of time, the LC-VCO 20 and the VCXO 28 are locked to the data frequency. Without valid input data in the data signal D, the LC-VCO 20 follows the VCXO 28, which is free running. When valid data appears in the data signal D, the LC-VCO 20 and the VCXO 28 will reacquire the data signal D. However, the LC-VCO 20 and the VCXO 28 require a long acquisition time to reacquire the data signal D, i.e., recover the clock signal included in the data signal D. The relatively small modulation bandwidth of the VCXO 28 is the chief factor causing the long reacquisition time.

Figure 2:
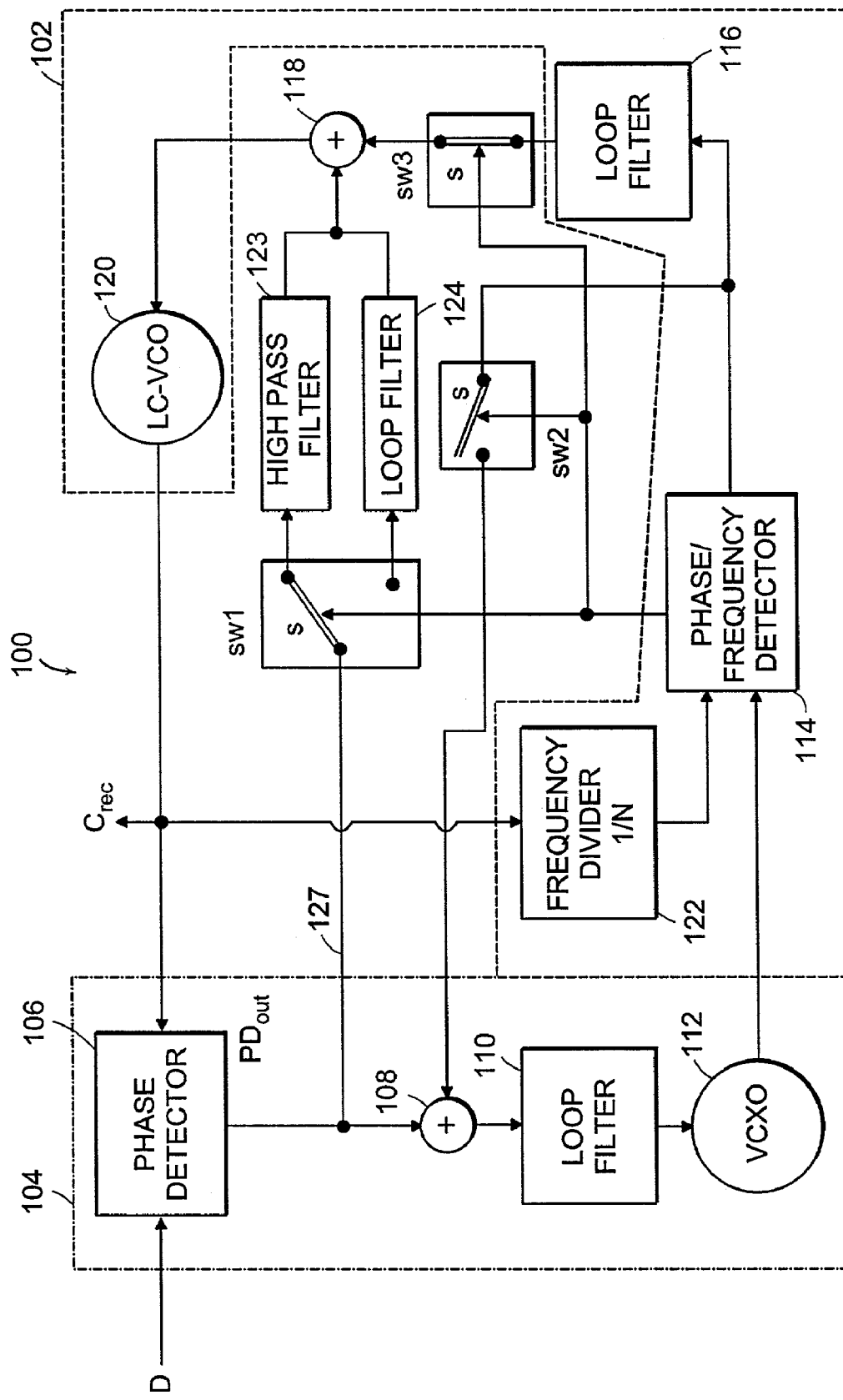
FIG. 2 is a block drawing of a clock recovery circuit in accord with the present invention operating in a normal mode.
Figure 3:
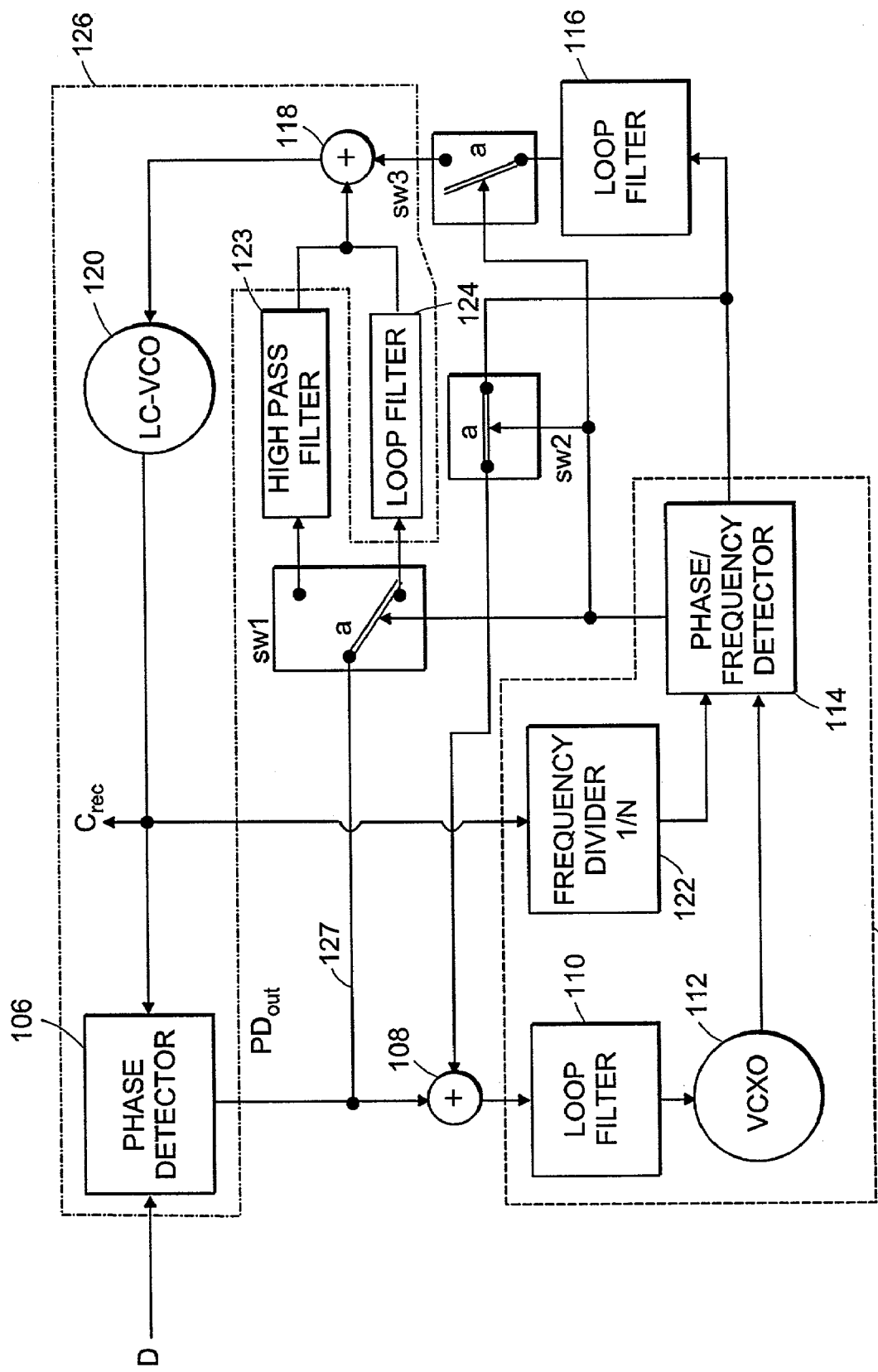
FIG. 3 is a block drawing of the clock recovery circuit of FIG. 2 operating in a fast acquisition mode.

FIGS. 2 and 3 illustrate a clock recovery circuit 100 in accord with the present invention. The circuit 100 includes an inner PLL circuit 102 and an outer PLL circuit 104. A phase detector 106 receives the data signal D and outputs a phase detected signal $PD_{out}$ to a summing circuit 108 which sums phase detected signal $PD_{out}$ with an output from a switch SW2 to provide an input to a loop filter 110. The output signal from the loop filter 110 is supplied to a voltage controlled crystal oscillator (VCXO) 112. The output signal from the VCXO 112 is supplied to a phase/frequency detector 114. The phase/frequency detector 114 supplies a switch control or lock detect signal SW to switches SW1, SW2 and SW3 to change the positions of those switches, as discussed more fully hereinbelow. The output signal from the phase/frequency detector 114 is supplied to a second loop filter 116 and to the input of the switch SW2. The output from the switch SW2 is supplied to the summing circuit 108. The output signal from the second loop filter 116 is input to the switch SW3 which provides an input to a summing circuit 118 and thence, to an inductance capacitance voltage controlled oscillator (LC-VCO) 120. The output of the LC-VCO 120 ($C_{rec}$) is supplied to the phase detector 106 and to a 1/N frequency divider circuit 122. The frequency divider circuit 122 divides the signal from the LC-VCO 120 by N and supplies the divided signal to the clock input of the phase/frequency detector 114. (Just as in the case of the circuit 10 of FIG. 1, the frequency divider circuit 122 may be omitted from the circuit 100 and the circuit 100 will operate as hereinbelow described.) The phase detected signal $PD_{out}$ is also supplied from the phase detector 106 to the switch SW1 which switches phase detected signal $PD_{out}$ between a high pass filter 123 or a third loop filter 124, depending upon the position of the switch SW1, as described more fully hereinbelow. The output from the high pass filter 123 or the third loop filter 124 is supplied to the summing circuit 118.

It will be noted that the circuit 100 of FIG. 2 includes the three switches SW1, SW2, SW3, and the third loop filter 124, which are not included in the circuit 10 of FIG. 1. The switch control or lock detect signal SW from the phase/frequency detector 114 controls the positions of the switches SW1, SW2 and SW3. The switches SW1, SW2, and SW3 are in the steady state (herein abbreviated as the "s" position) in FIG. 2, while they are in the fast acquiring state (herein abbreviated as the "a" position) in FIG. 3. In the steady state, the switch SW1 is positioned to supply the phase detected signal $PD_{out}$ from the phase detector 106 to the high pass filter 123, the switch SW2 is positioned to break the connection between the phase/frequency detector 114 and the summing circuit 108, and the switch SW3 is positioned to make the connection between the second loop filter 116 and the summing circuit 118.

As shown in FIG. 3, in the fast acquiring state, the switch SW1 is positioned to supply the phase detected signal $PD_{out}$ to the third loop filter 124, the switch SW2 is positioned to supply the output signal from the phase/frequency detector 114 to the summing circuit 108, and the switch SW3 is open, thereby breaking the connection between the second loop filter 116 and the summing circuit 118.

When the switch SW1 is placed in the steady or "s" state, as depicted in FIG. 2, the circuit 100 establishes the inner phase locked loop circuit 102, which comprises the phase/frequency detector 114, the second loop filter 116, and the LC-VCO 120. (The frequency divider circuit 122 may also be included in the inner phase locked loop circuit 102, but as discussed hereinbefore, the frequency divider circuit 122 may also be omitted from the circuit 100.) The circuit 100 also establishes the outer phase locked loop circuit 104, which comprises the phase detector 106, the summing circuit 108, the loop filter 110, the VCXO 112, and the inner phase locked loop circuit 102. The switch SW1 also connects the high pass filter 123 to the summing circuit 118 to supply the phase detected signal $PD_{out}$ from the phase detector 106 to the LC-VCO 120. The switch SW2 is in the open position, so that the output signal from the phase/frequency detector 114 is not supplied to the summing circuit 108. The switch SW3 is in the closed position, thereby supplying the output signal from the second loop circuit 116 to the summing circuit 118.

When the switch SW1 is placed in the fast acquiring or "a" state, as depicted in FIG. 3, the circuit 100 establishes an inner phase locked loop 126, which comprises the LC-VCO 120, the phase detector 106 and the loop filter 124. The phase locked loop 126 uses the LC-VCO 120 to lock very quickly onto the data frequency or clock signal of the data signal D even at low SNR's. In one practical embodiment, the inner phase locked loop 126 was designed to meet the acquisition time requirements for SONET and SDH systems.

The switch control or lock detect signal SW also opens the switch SW3 in the fast acquiring or "a" state of FIG. 3, thereby opening the inner phase locked loop 102 of the circuit 100 in the "s" state depicted in FIG. 2. The switch control or lock detect signal SW also closes the switch SW2, thereby establishing an outer phase locked loop circuit 128, which comprises the loop filter 110, the VCXO 112, and the phase/frequency detector 114. The outer phase locked loop circuit 128 permits the VCXO 112 to follow the LC-VCO 120 until the VCXO 112 is also locked to the data frequency. In this instance, the phase/frequency detector 114 generates the switch control or lock detect signal SW to set the lock detect to inactive. An inactive lock detect condition for the switch control or lock detect signal SW corresponds to switch settings of the switches SW1, SW2 and SW3 of the circuit of FIG. 2 and state "A" in FIG. 4, respectively. It should be noted that the switch settings of the switches SW1, SW2, and SW3 as depicted in FIG. 2 represent the steady state or normal operating condition of the circuit 100.

Figure 4:
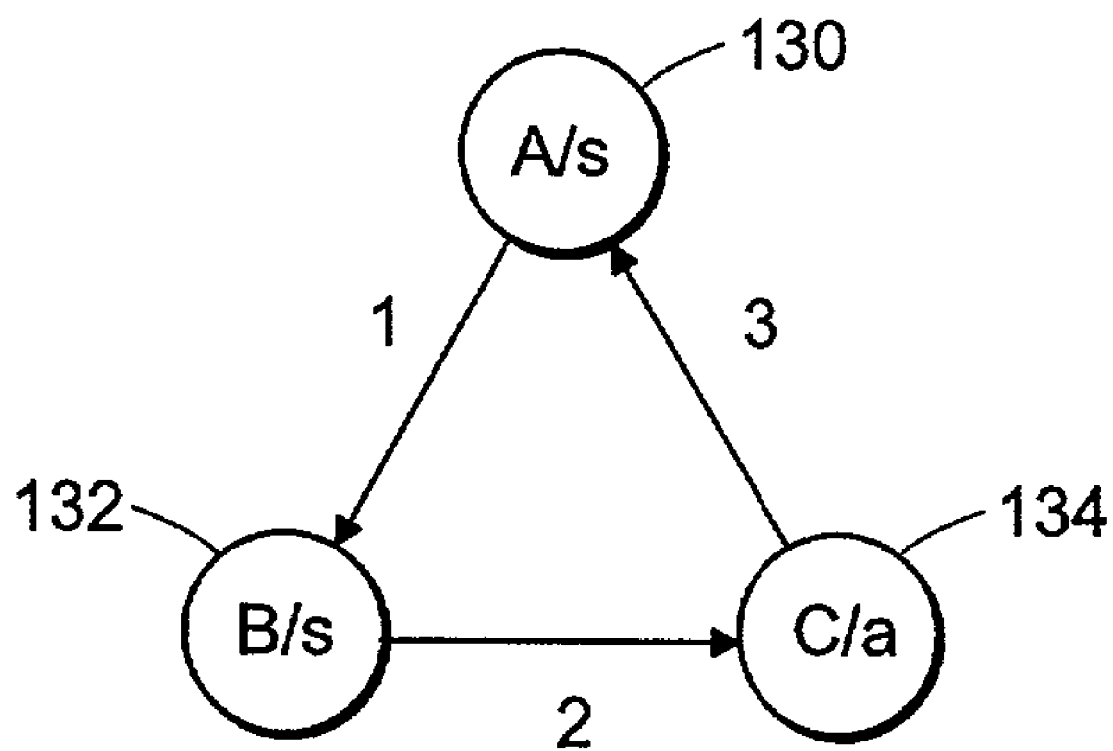
FIG. 4 is a state diagram for the circuit of FIGS. 2 and 3.

FIG. 4 is a state diagram for the circuit 100 of FIGS. 2 and 3. Table 1 identifies the state of the circuit 100, the switch settings for the switches SW1, SW2, and SW3, and the description of the circuit 100 in the selected state. Table 2 identifies the transitions of FIG. 4 and the corresponding descriptions of the circuit 100.

TABLE 1

| State | Switch Settings | Description of State |
|---|---|---|
| A | s | Valid input data; f(VCXO) = f(LC-VCO) |
| B | s | No input data; VCXO is free running; f(LC-VCO) = f(VCXO) |
| C | a | Valid input data; f(VCXO) ≠ f(LC-VCO); lock detect is active |

TABLE 2

| Transition | Description of Transition |
|---|---|
| 1 | Input data is no longer valid |
| 2 | Input data becomes valid but f(VCXO) ≠ f(LC-VCO); lock detect is being activated |
| 3 | Input data is valid; VCXO has locked to data; lock detect is being deactivated |

When the circuit 100 is in state "A", as indicated by the numeral 130 on FIG. 4, the switches SW1, SW2, and SW3 are in the "s" position, the data D supplied to the circuit 100 is valid, and the frequency of the VCXO 112 is the same as the frequency of the LC-VCO 120.

When transition 1 occurs, so that the circuit 100 moves from the state "A" 130 to the state "B" 132, the switches SW1, SW2, and SW3 are in the "s" position, but the digital data D supplied to the circuit 100 is not valid, e.g., there is no data being supplied to the circuit 100. In state "B" 132, the VCXO 112 is free running. The LC-VCO 120 follows the VCXO 112, so the frequency of the VCXO 112 is the same as the frequency of the LC-VCO 120.

When transition 2 occurs, so that the circuit moves from the state "B" 132 to the state "C" 134, the switches SW1, SW2, and SW3 are in the "a" position. The digital data D supplied to the circuit 100 is again valid. However, the frequency of the VCXO 112 is not the same as the frequency of the LC-VCO 120, as the LC-VCO 120 is in the fast acquiring mode and is locking onto the clock signal in the data signal D.

When transition 3 occurs, so that the circuit moves from the state "C" 134 back to the state "A" 130, the input data for the data signal D is valid, the VCXO 112 has locked onto the data signal D, and the phase/frequency detector 114 generates the switch control or lock detect signal SW to deactivate the lock detect.

It will be appreciated from the above description that a circuit 100 in accord with the present invention has a short frequency acquisition time for signals with a low SNR, and can be advantageously used with optical networking applications such as SONET and SDH.

Although a specific embodiment of the present invention has been described in detail herein with reference to the accompanying drawings, it is to be understood that the invention is not limited to that precise embodiment, and that various changes and modifications may be effected therein by one skilled in the art without departing from the spirit and scope of the invention as defined in the appended claims.

The invention claimed is:

1. A clock recovery circuit for use with a high-speed data signal having a low signal to noise ratio comprising:
    a. a first phase locked loop circuit operating in a fast acquisition mode for acquiring said data signal;
    b. a second phase locked loop circuit for operating in a normal mode to recover a clock signal in said data signal once said first phase locked loop circuit has acquired said clock from said data signal; and
    c. a switch circuit responsive to switch control signals for switching between said first phase locked loop circuit and said second phase locked loop circuit after said first phase locked loop circuit has acquired said clock from said data signal, wherein each of said first and second phase locked loop circuits includes inner and outer phase locked loop circuits.

2. The circuit of claim 1, wherein said first phase locked loop circuit includes a voltage controlled crystal oscillator circuit with a modulation bandwidth, and said second phase locked loop circuit includes an LC-voltage controlled oscillator circuit with a modulation bandwidth larger than the modulation bandwidth of the voltage controlled crystal oscillator.

3. The circuit of claim 1, wherein said switch circuit includes a plurality of switches and a first loop filter.

4. The circuit of claim 3, wherein said inner phase locked loop circuit of said first phase locked loop circuit comprises:
    a. a first phase detector for receiving said data signal;
    b. an LC-voltage controlled oscillator coupled to said first phase detector; and
    c. said first loop filter coupled to said LC-voltage controlled oscillator.

5. The circuit of claim 4, wherein said outer phase locked loop circuit of said first phase locked loop circuit comprises:
    a. a second loop filter for receiving said phase detected signal from said first phase detector;
    b. a voltage controlled crystal oscillator coupled to said second loop filter; and
    c. a phase/frequency detector coupled to said voltage controlled crystal oscillator and generating said switch control signals for said switch circuit.

6. The circuit of claim 5, wherein said inner phase locked loop circuit of said second phase locked loop circuit comprises:
   a. said phase/frequency detector;
   b. a third loop filter coupled to said phase/frequency detector; and
   c. said LC-voltage controlled oscillator.

7. The circuit of claim 6, wherein said outer phase locked loop circuit of said second phase locked loop circuit comprises:
   a. said first phase detector;
   b. said second loop filter coupled to said first phase detector;
   c. said voltage controlled crystal oscillator coupled to said second loop filter; and
   d. said inner phase locked loop circuit of said second phase locked loop circuit.

8. The circuit of claim 7, wherein said switch circuit further comprises:
   a. a high pass filter; and
   b. a first switch coupled to said first phase detector for supplying said phase detected signal to one of said high pass filter and said loop filter in response to said switch control signals.

9. The circuit of claim 8, wherein said switch circuit further comprises:
   a. a summing circuit disposed between said LC-voltage controlled oscillator and said third loop filter; and
   b. a second switch for coupling said summing circuit and said third loop filter in response to said switch control signals.

10. The circuit of claim 9, wherein said switch circuit further comprises a third switch for coupling said phase/frequency detector to said second loop filter in response to said switch control signals.

11. The circuit of claim 10, and further comprising a frequency divider coupled to said LC-voltage controlled oscillator and said phase/frequency detector.

12. A clock recovery circuit for use with a high-speed data signal having a low signal to noise ratio comprising:
   a. a first phase locked loop circuit operating in a fast aquisition mode for acquiring said data signal;
   b. a second phase locked loop circuit for operating in a normal mode to recover a clock signal in said data signal once said first phase locked loop circuit has acquired said clock from said data signal; and
   c. a switch circuit responsive to switch control signals for switching between said first phase locked loop circuit and said second phase locked loop circuit after said first phase locked loop circuit has acquired said clock from said data signal;
   d. a switch control circuit signal source for outputting said switch control signals in response to said data signal, wherein said switch control signal source includes a phase detector for receiving the data signal and outputting a phase detected data signal in response thereto, a loop filter for receiving the phase detected signal and providing an output, a voltage controlled crystal oscillator coupled to the loop filter and providing an output signal in response to the output of the loop filter, a phase frequency detector coupled to the voltage controlled crystal oscillator, the phase frequency detector outputting said switch control signal in response to an output from said voltage controlled crystal oscillator.

13. In a clock recovery circuit with first and second phase locked loop circuits, for use with a high speed data signal having a low signal to noise ratio, the improvement comprising a switch circuit for switching between said first phase locked loop circuit operating in a fast acquisition mode for acquiring said clock from the data signal and said second phase locked loop circuit operating in a normal mode after said first phase locked loop circuit has acquired said clock from the data signal wherein each of said first and second phase locked loop circuits includes inner and outer phase locked loop circuits.

14. The improvement claim 13, wherein said first phase locked loop circuit includes a voltage controlled crystal oscillator circuit with a small modulation bandwidth.

15. The improvement of claim 14, wherein said second phase locked loop circuit includes an LC-voltage controlled oscillator circuit with a large modulation bandwidth.

16. The improvement of claim 13, wherein said switch circuit includes a plurality of switches and a filter.

17. A clock recovery circuit for use with a high speed data signal having a low signal to noise ratio comprising:
   a. a first PLL circuit operating in a fast acquisition mode for acquiring a clock from said data signal, comprising:
      i. an inner PLL circuit comprising:
         1. a first phase detector for receiving said data signal and outputting a phase detected signal;
         2. an LC-voltage controlled oscillator coupled to said first phase detector; and
         3. a first loop filter coupled to said LC-voltage controlled oscillator.
      ii. an outer PLL circuit comprising:
         1. a second loop filter for receiving said phase detected signal;
         2. a voltage controlled crystal oscillator coupled to said second loop filter; and
         3. a phase/frequency detector coupled to said voltage controlled crystal oscillator and generating switch control signals;
   b. a second PLL circuit for operating in a normal mode to recover the clock signal in said digital data signal once said first PLL circuit has acquired said clock from the data signal, comprising:
      iii. an inner PLL circuit comprising:
         1. said phase/frequency detector;
         2. a third loop filter coupled to said phase/frequency detector; and
         3. said LC-voltage controlled oscillator.
      iv. an outer PLL circuit comprising:
         1. said first phase detector;
         2. said second loop filter coupled to said first phase detector;
         3. said voltage controlled crystal oscillator coupled to said second loop filter; and
         4. said inner PLL circuit of said second PLL circuit;
   c. a switch circuit responsive to said switch control signals for switching between said first PLL circuit and said second PLL circuit after said first PLL circuit has acquired said clock from the data signal.

18. The circuit of claim 17, wherein said switch circuit further comprises:
   a. a high pass filter; and
   b. a first switch coupled to said first phase detector for supplying said phase detected signal to one of said high pass filter and said loop filter in response to said switch control signals.

19. The circuit of claim 18, wherein said switch circuit further comprises:
   a. a summing circuit disposed between said LC-voltage controlled oscillator and said third loop filter; and
   b. a second switch for coupling said summing circuit and said third loop filter in response to said switch control signals.

* * * * *